United States Patent
You

(10) Patent No.: US 12,507,390 B2
(45) Date of Patent: Dec. 23, 2025

(54) SEMICONDUCTOR STRUCTURE AND METHOD FOR FORMING SAME

(71) Applicant: CHANGXIN MEMORY TECHNOLOGIES, INC., Hefei (CN)

(72) Inventor: Kang You, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 353 days.

(21) Appl. No.: 18/163,843

(22) Filed: Feb. 2, 2023

(65) Prior Publication Data

US 2023/0413507 A1 Dec. 21, 2023

Related U.S. Application Data

(63) Continuation of application No. PCT/CN2022/103007, filed on Jun. 30, 2022.

(30) Foreign Application Priority Data

Jun. 16, 2022 (CN) .......................... 202210686849.3

(51) Int. Cl.
H10B 12/00 (2023.01)

(52) U.S. Cl.
CPC ........... *H10B 12/03* (2023.02); *H10B 12/482* (2023.02); *H10B 12/488* (2023.02)

(58) Field of Classification Search
CPC ............................................. H10B 12/00–50
See application file for complete search history.

(56) References Cited

U.S. PATENT DOCUMENTS

| 11,094,699 | B1 | 8/2021 | Brewer |
| 2018/0323199 | A1 | 11/2018 | Roberts et al. |

(Continued)

FOREIGN PATENT DOCUMENTS

| CN | 110520989 A | 11/2019 |
| CN | 113745224 A | 12/2021 |

(Continued)

OTHER PUBLICATIONS

Extended European Search Report in application No. EP22871075, mailed on Apr. 30, 2024.

(Continued)

*Primary Examiner* — Tucker J Wright
(74) *Attorney, Agent, or Firm* — Syncoda LLC; Feng Ma

(57) ABSTRACT

A method for forming a semiconductor structure includes: providing a substrate, the substrate including a first isolation groove extending in a first direction and a plurality of active columns arranged in an array along the first direction and a third direction, the substrate being divided into a first area and a second area by the first isolation groove along a second direction, the active columns being supported through support structures; forming semi-capacitor structures located in the first area and gate-all-around structures located in the second area in gaps between the active columns; processing the active columns and the semi-capacitor structures in the first area to form capacitor structures extending in the second direction; and forming first connecting structures connecting the gate-all-around structures and the capacitor structures in the first isolation groove.

15 Claims, 29 Drawing Sheets

(56) References Cited

U.S. PATENT DOCUMENTS

| | | |
|---|---|---|
| 2021/0159229 A1 | 5/2021 | Gomes et al. |
| 2021/0359122 A1 | 11/2021 | Or-Bach |
| 2021/0375875 A1 | 12/2021 | Brewer et al. |
| 2022/0013524 A1 | 1/2022 | Ryu et al. |
| 2022/0068859 A1 | 3/2022 | Choi et al. |
| 2022/0130834 A1 | 4/2022 | Lee et al. |
| 2022/0320103 A1 | 10/2022 | Lee et al. |
| 2023/0309289 A1* | 9/2023 | Choi .................. H10B 12/03 |

FOREIGN PATENT DOCUMENTS

| | | |
|---|---|---|
| CN | 113903741 A | 1/2022 |
| CN | 114582809 A | 6/2022 |
| JP | 2019068067 A | 4/2019 |
| KR | 20190038223 A | 4/2019 |

OTHER PUBLICATIONS

KR first office action in application No. 10-2023-7040415, mailed on Jul. 15, 2024.
JP first office action in application No. 2023-572160, mailed on Dec. 17, 2024.

\* cited by examiner

US 12,507,390 B2

SEMICONDUCTOR STRUCTURE AND METHOD FOR FORMING SAME

CROSS-REFERENCE TO RELATED APPLICATIONS

This is a continuation of International Patent Application No. PCT/CN2022/103007 filed on Jun. 30, 2022, which claims priority to Chinese Patent Application No. 202210686849.3 filed on Jun. 16, 2022. The disclosures of the above-referenced applications are hereby incorporated by reference in their entirety.

BACKGROUND

A Dynamic Random Access Memory (DRAM) is a semiconductor storage device commonly used in a computer. The DRAM is composed of many duplicate storage units. Each storage unit usually includes a capacitor and a transistor.

In a DRAM in a related art, the transistor is horizontal, and the capacitor is perpendicular to the transistor. With continuous development of process nodes, the integration degree of the DRAM is continuously improved and the size is continuously reduced, the aspect ratio of the capacitor is larger and larger, the size of transistors is smaller and smaller, and the process complexity and manufacturing cost of the DRAM are improved gradually.

SUMMARY

The disclosure relates to the technical field of semiconductors, and relates to, but is not limited to, a semiconductor structure and a method for forming a semiconductor structure.

In a first aspect, an embodiment of the disclosure provides a method for forming a semiconductor structure, which includes: providing a substrate, the substrate comprising a first isolation groove extending in a first direction and a plurality of active columns arranged in an array along the first direction and a third direction, the substrate being divided into a first area and a second area by the first isolation groove along a second direction, the active columns being supported through support structures, the first direction, the second direction and the third direction being perpendicular to each other in pairs, the first direction and the second direction being parallel to an upper surface of the substrate; forming semi-capacitor structures located in the first area and gate-all-around structures located in the second area in gaps between the active columns; processing the active columns and the semi-capacitor structures in the first area to form capacitor structures extending in the second direction; and forming first connecting structures connecting the gate-all-around structures and the capacitor structures in the first isolation groove.

In a second aspect, an embodiment of the disclosure provides a semiconductor structure, which is formed by the above method for forming a semiconductor structure and includes: a substrate; the substrate includes a first area and a second area arranged in a second direction, and the second area includes active columns arranged in an array along a first direction and a third direction; wherein the first direction, the second direction and the third direction are perpendicular to each other in pairs, and the first direction and the second direction are parallel to an upper surface of the substrate; capacitor structures located in the first area, and gate-all-around structures located in the second area; the gate-all-around structures surround surfaces of the active columns; first connecting structures connecting the gate-all-around structures and the capacitor structures; and support structures supporting the capacitor structures and the gate-all-around structures.

BRIEF DESCRIPTION OF THE DRAWINGS

In the drawings (which are not necessarily drawn to scale), similar reference numerals may describe similar parts/elements in different views. Similar reference numerals with different letter suffixes may represent different examples of similar parts. The drawings generally illustrate the various embodiments discussed herein by way of examples rather than limitation.

Figure 1:
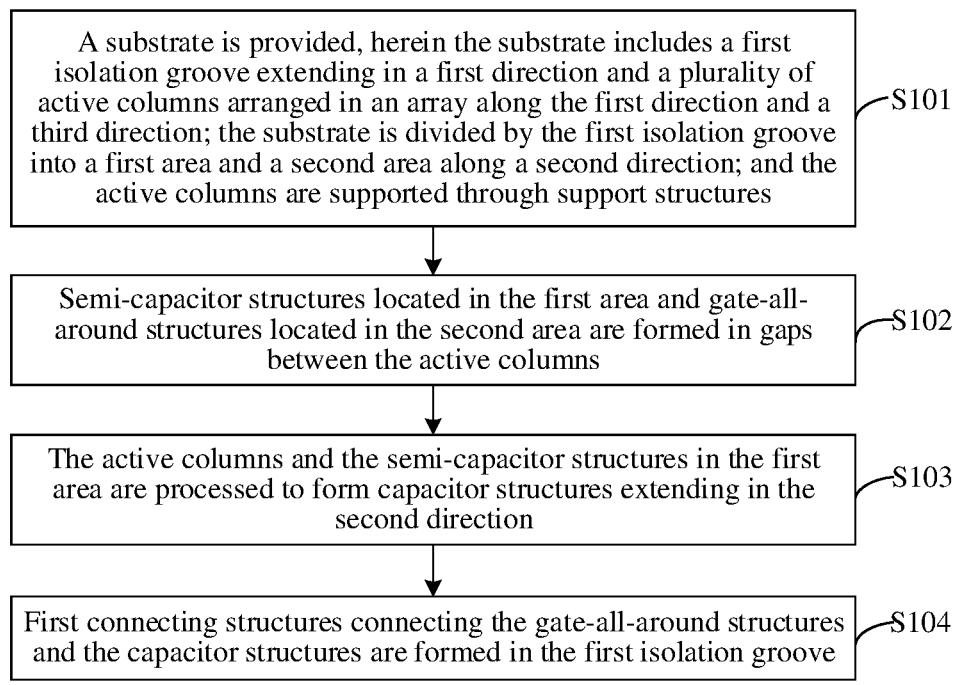
FIG. 1 illustrates a schematic flow chart of a method for forming a semiconductor structure according to an embodiment of the disclosure.

Reference numerals in the drawings are described as follows,

10—semiconductor substrate; 11—stacked structure; 111—first semiconductor layer; 112—second semiconductor layer; 110—active column; 12—first isolation groove; 12a—second isolation groove; 121—sacrificial layer; 13—third isolation groove; 13a—fourth isolation groove; 131—protective layer; 14—support structure; 151—first mask layer; 152—second mask layer; 153—third mask layer; 161—first photoresist layer; 162—second photoresist layer; 163—third photoresist layer; 164—fourth photoresist layer; 165—fifth photoresist layer; 166—sixth photoresist layer; 167—seventh photoresist layer; 17—gate-all-around structure; 171—medium layer; 1711—first medium layer; 1712—second medium layer; 172—dielectric layer; 173—first metal layer; 174—second metal layer; 175—insulating medium layer; 176—third metal layer; 18—semi-capacitor structure; 19—first isolation layer; 20—capacitor structure; 21—first opening; 22—first gap; 23—first connecting structure; 24—second isolation layer; 25—bit line structure; 26—stepped word line structure; 27—second connecting structure; 28—third isolation layer; 291—first metal wire; 292—second metal wire; 293—third metal wire; 30—barrier layer; 31—fifth isolation groove; 310—isolation structure; and 100—semiconductor structure.

DETAILED DESCRIPTION

Exemplary embodiments of the disclosure will be described below in more detail with reference to the drawings. Although the exemplary embodiments of the disclosure are shown in the drawings, it should be understood that, the disclosure may be implemented in various forms and should not be limited by the specific embodiments elaborated herein. On the contrary, these embodiments are provided to enable a more thorough understanding of the disclosure and to fully convey the scope of the disclosure to those skilled in the art.

In the following description, a large number of details are given to provide a more thorough understanding of the disclosure. However, it will be apparent to those skilled in the art that the disclosure may be implemented without one or more of these details. In other examples, in order to avoid confusion with the disclosure, some technical features known in the art are not described. That is, all the features of the actual embodiments are not described here, and the known functions and structures are not described in detail.

In the drawings, the dimensions of layers, areas, and elements and their relative dimensions may be exaggerated for clarity. Throughout, the same reference numerals represent the same elements.

It is to be understood that description that an element or layer is "above/on", "adjacent to", "connected to/with", or "coupled to" another element or layer may refer to that the element or layer is directly above, adjacent to, connected to or coupled to the other element or layer; or there may be an intermediate element or layer. On the contrary, description that an element is "directly on", "directly adjacent to", "directly connected to" or "directly coupled to" another element or layer refers to that there is no intermediate element or layer. It is to be understood that, although various elements, components, areas, layers, and/or parts may be described with terms first, second, third, etc., these elements, components, areas, layers, and/or parts should not be limited to these terms. These terms are used only to distinguish one element, component, area, layer or part from another element, component, area, layer or part. Therefore, a first element, component, area, layer, or part discussed below may be represented as a second element, component, area, layer, or part without departing from the teaching of the disclosure. However, when the second element, component, area, layer, or part is discussed, it does not mean that the first element, component, area, layer, or part must exist in the disclosure.

The terms used herein are intended only to describe specific embodiments and are not a limitation of the disclosure. As used herein, singular forms "a/an", "one", and "the" may also be intended to include the plural forms, unless otherwise specified types in the context. It is also to be understood that, when terms "composed of" and/or "including" are used in this specification, the presence of the features, integers, steps, operations, elements, and/or components may be determined, but the presence or addition of one or more other features, integers, steps, operations, elements, components, and/or groups is also possible. As used herein, terms "and/or" includes any and all combinations of the related listed items.

Before introducing the embodiments of the disclosure, three directions for describing a three-dimensional structure that may be used in the following embodiments are defined first. Taking a Cartesian coordinate system as an example, the three directions may include an X-axis direction, a Y-axis direction, and a Z-axis direction. The substrate may include a top surface located on a front side and a bottom surface located on a back side opposite to the front side. The direction perpendicular to the top surface and the bottom surface of the substrate is defined as the third direction in a case of ignoring the flatness of the top surface and the bottom surface. In the direction of the top surface and the bottom surface (that is, the plane on which the substrate is located) of the substrate, two directions that intersect each other (e.g., perpendicular to each other) are defined. For example, an extending direction of a first isolation groove may be defined as a first direction, an extending direction of a third isolation groove may be defined as a second direction, and a plane direction of the semiconductor substrate may be determined on the basis of the first direction and the second direction. Here, the first direction, the second direction, and the third direction are perpendicular to each other in pairs. In the embodiments of the disclosure, the first direction is defined as the X-axis direction, the second direction is defined as the Y-axis direction, and the third direction is defined as the Z-axis direction.

An embodiment of the disclosure provides a method for forming a semiconductor structure. FIG. 1 illustrates a schematic flow chart of a method for forming a semiconductor structure according to an embodiment of the disclosure. As shown in FIG. 1, the method for forming the semiconductor structure includes as follows.

At S101, a substrate is provided. The substrate includes a first isolation groove extending in a first direction and a plurality of active columns arranged in an array along the first direction and a third direction. The substrate is divided by the first isolation groove into a first area and a second area along a second direction. The active columns are supported through support structures.

In the embodiments of the disclosure, the substrate at least includes a semiconductor substrate. The semiconductor substrate may be a silicon base substrate. The semiconductor substrate may also include other semiconductor elements such as germanium (Ge), or include semiconductor compounds such as silicon carbide (SiC), gallium arsenide (GaAs), gallium phosphide (GaP), indium phosphide (InP), indium arsenide (InAs), or indium antimonide (InSb), or include other semiconductor alloys such as silicon germanium (SiGe), gallium arsenide phosphide (GaAsP), indium aluminum arsenide (AlInAs), gallium aluminum arsenide (AlGaAs), indium gallium arsenide (GaInAs), indium gallium phosphide (GaInP), and/or indium gallium arsenide phosphide (GaInAsP) or a combination thereof.

In the embodiments of the disclosure, the substrate is divided into the first area and the second area by the first isolation groove in the second direction. The first area and the second area may respectively be configured to form different functional structures. For example, the first area may be configured to form a capacitor structure. The second area may be configured to form a gate-all-around structure, a bit line structure, and a stepped word line structure.

In the embodiments of the disclosure, the substrate includes a plurality of active columns and the support structures arranged in an array in the first direction and the third direction. The plurality of active columns are supported through the support structures. Each active column is configured to form a transistor.

The support structure extends in the first direction and the third direction. The support structure may be located on a surface of the semiconductor substrate, or may also extend into the semiconductor substrate, so as to achieve a better supporting effect.

In the embodiments of the disclosure, the active columns may be square prisms (such as, quadrangular prisms, hexagonal prisms, and octagonal prisms) or cylinders.

At S102, semi-capacitor structures located in the first area and gate-all-around structures located in the second area are formed in gaps between the active columns.

In the embodiments of the disclosure, the first area is configured to form capacitor structures, and the second area is configured to from the gate-all-around structures. The semi-capacitor structure is not an incomplete capacitor structure, but a part of the capacitor structure, for example, a capacitor structure only including one electrode layer, or a capacitor structure only including a dielectric layer and an electrode layer.

In the embodiments of the disclosure, the formed gate-all-around structure has a wide channel area, so that a short channel effect can be reduced, and the control capacity of a gate electrode can further be improved, thereby improving the performance of the formed semiconductor structure.

At S103, the active columns and the semi-capacitor structures in the first area are processed to form capacitor structures extending in the second direction.

In the embodiments of the disclosure, the active columns in the first area are processed, for example, an electrode layer may be formed in the first area, or a dielectric layer and an electrode layer may be formed in the first area to convert a semi-capacitor structure into a complete capacitor structure.

In the embodiments of the disclosure, the formed capacitor structures are arranged at intervals in the first direction and the third direction, and extend in the second direction. That is to say, the capacitor structures formed in the embodiments of the disclosure are arranged horizontally, and the horizontal capacitor structures can reduce the possibility of tipping or breaking, so that the stability of the capacitor structure can be improved.

At S104, first connecting structures connecting the gate-all-around structures and the capacitor structures are formed in the first isolation groove.

During implementation, a wire can be grown on a channel surface in the gate-all-around structure by an epitaxy technology as the first connecting structure. The first connecting structure extends in the second direction and is electrically connected with an electrode layer of the capacitor structure.

In the embodiments of the disclosure, firstly, a first isolation groove extending in a first direction and a plurality of active columns arranged in an array along the first direction and a third direction are formed on the substrate first. The substrate may be divided into a first area and a second area by the first isolation groove in the first direction, so as to prepare different functional devices in different areas. Secondly, semi-capacitor structures located in the first area and gate-all-around structures located in the second area are formed in gaps between the active columns. Thirdly, the active columns and the semi-capacitor structures in the first area are processed, so as to form capacitor structures extending in the second direction. The capacitor structure includes a semi-capacitor structure. Finally, first connecting structures connecting the gate-all-around structures and the capacitor structures are formed in the first isolation groove. Since the gate-all-around structures and the semi-capacitor structures constituting the capacitor structures are formed at the same time, so that a process for preparing the semiconductor structure can be simplified, and the manufacturing cost of the semiconductor structure can be reduced. In addition, since the capacitor structure in the embodiments of the disclosure extends in the second direction, that is, the capacitor structure in the embodiments of the disclosure is horizontal. Compared with a vertical capacitor structure with a large depth-to-width ratio, the horizontal capacitor structure can reduce the possibility of tipping or breaking, so that the stability of the capacitor structure can be improved. Moreover, the stacked structure formed by stacking a plurality of capacitor structures in the third direction can form a three-dimensional semiconductor structure, so as to improve the integration degree of the semiconductor structure and realize miniaturization.

Figure 2A:
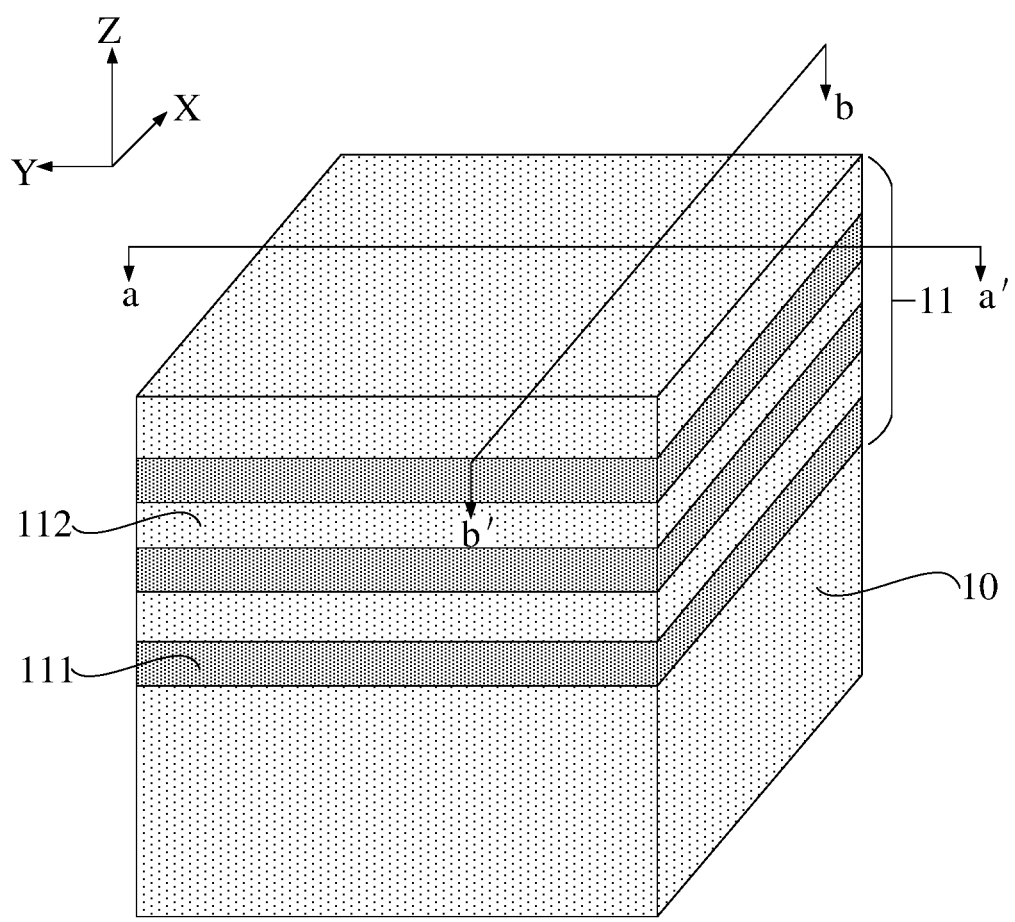
FIG. 2A illustrates a first schematic structural diagram in a process for forming a semiconductor structure according to embodiments of the disclosure.
Figure 2B:
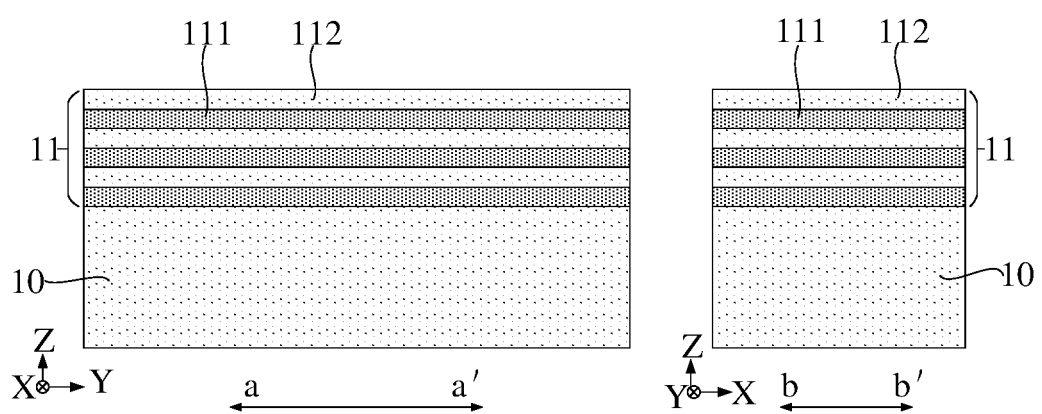
FIG. 2B illustrates a second schematic structural diagram in a process for forming a semiconductor structure according to embodiments of the disclosure.

FIG. 2A to FIG. 2N and FIG. 3A to FIG. 3M illustrate schematic structural diagrams in a process for forming a semiconductor structure according to embodiments of the disclosure. FIG. 2A illustrates a three-dimensional schematic structural diagram. FIG. 2B illustrates a sectional view of a stacked structure in FIG. 2A in a-a' and b-b'. In order to facilitate the detailed introduction of an internal structure of the formed semiconductor structure, FIGS. 2C to 2N and FIGS. 3A to 3M in a subsequent formation process are all shown in the perspective of sectional views of a-a' and b-b'. A process for forming the semiconductor structure according to the embodiments of the disclosure is described in detail with reference to FIGS. 2A to 2N and FIGS. 3A to 3M.

Figure 2C:
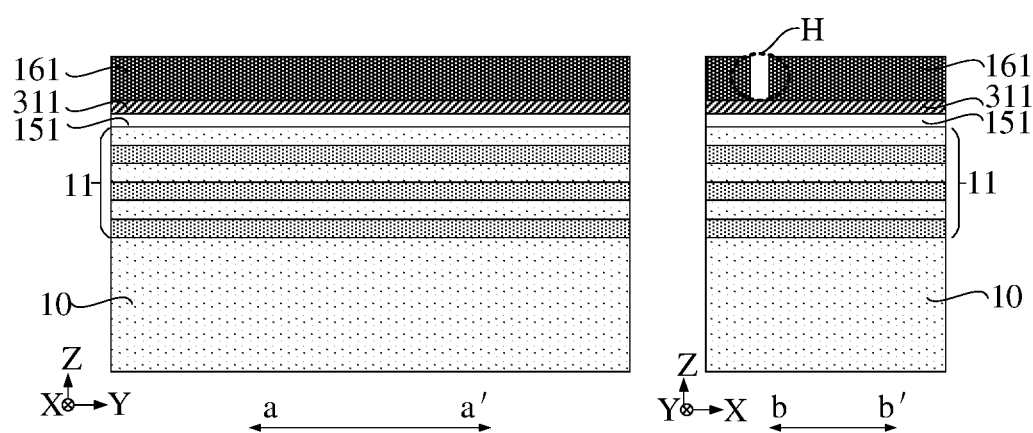
FIG. 2C illustrates a third schematic structural diagram in a process for forming a semiconductor structure according to embodiments of the disclosure.
Figure 2D:
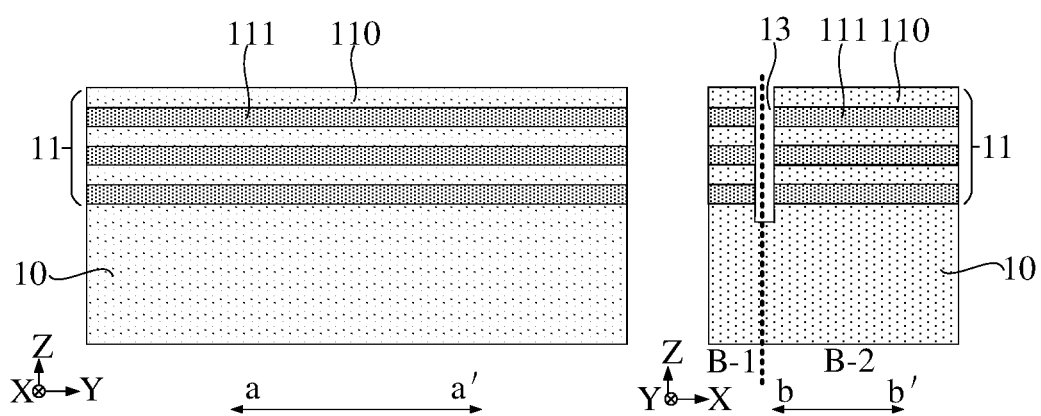
FIG. 2D illustrates a fourth schematic structural diagram in a process for forming a semiconductor structure according to embodiments of the disclosure.
Figure 2E:
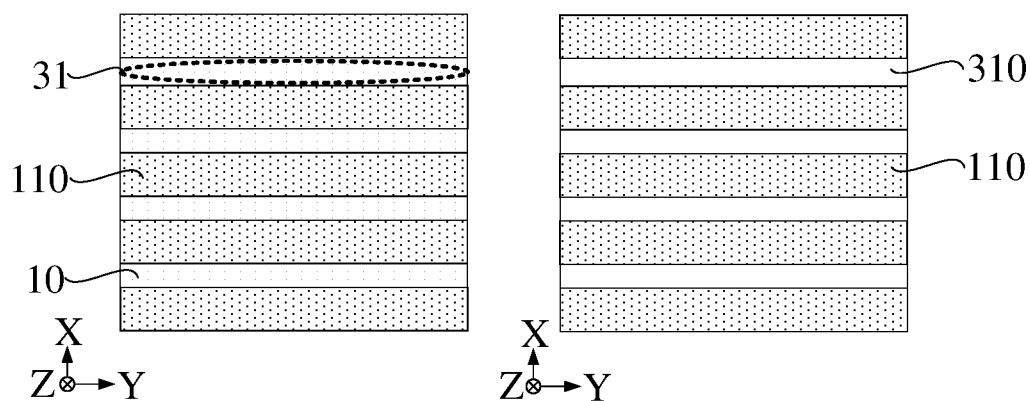
FIG. 2E illustrates a fifth schematic structural diagram in a process for forming a semiconductor structure according to embodiments of the disclosure.
Figure 2F:
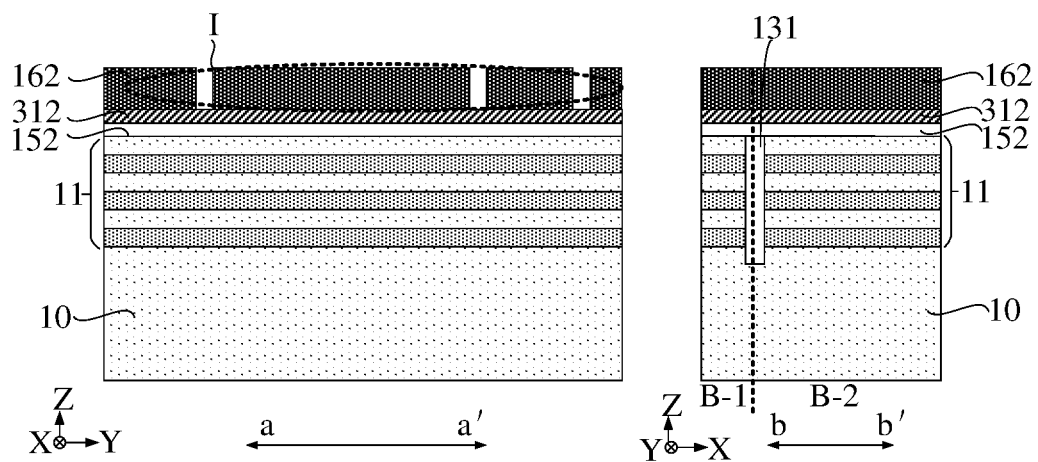
FIG. 2F illustrates a sixth schematic structural diagram in a process for forming a semiconductor structure according to embodiments of the disclosure.
Figure 2G:
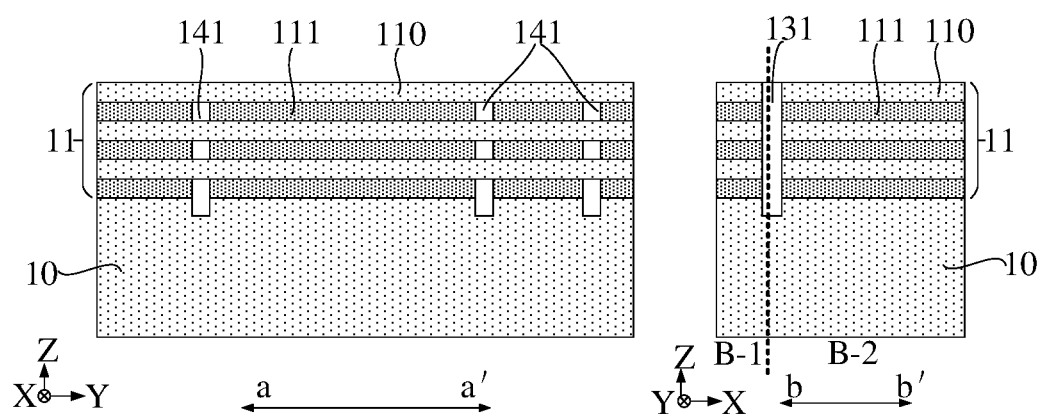
FIG. 2G illustrates a seventh schematic structural diagram in a process for forming a semiconductor structure according to embodiments of the disclosure.
Figure 2H:
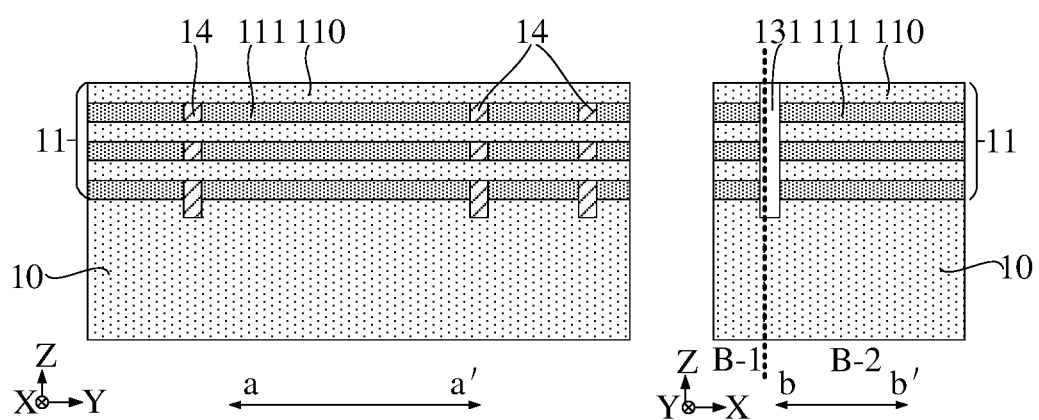
FIG. 2H illustrates an eighth schematic structural diagram in a process for forming a semiconductor structure according to embodiments of the disclosure.
Figure 2I:
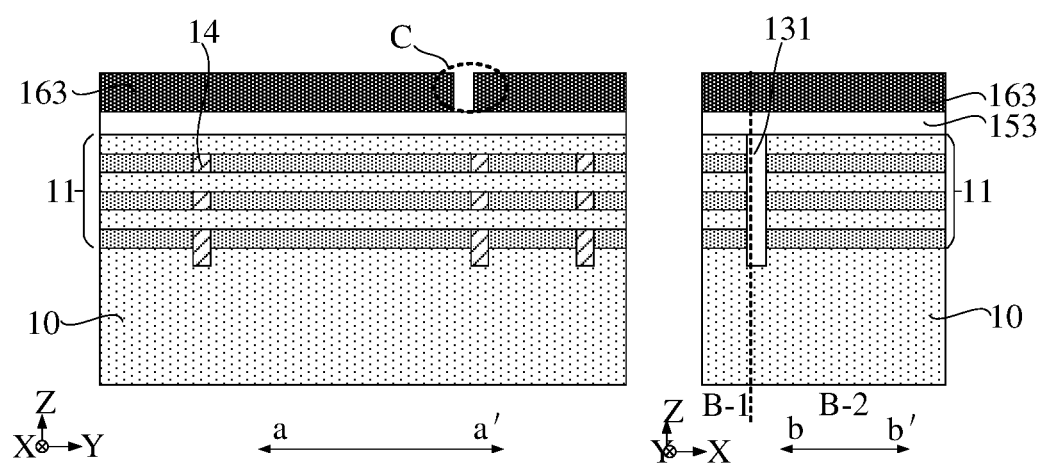
FIG. 2I illustrates a ninth schematic structural diagram in a process for forming a semiconductor structure according to embodiments of the disclosure.
Figure 2J:
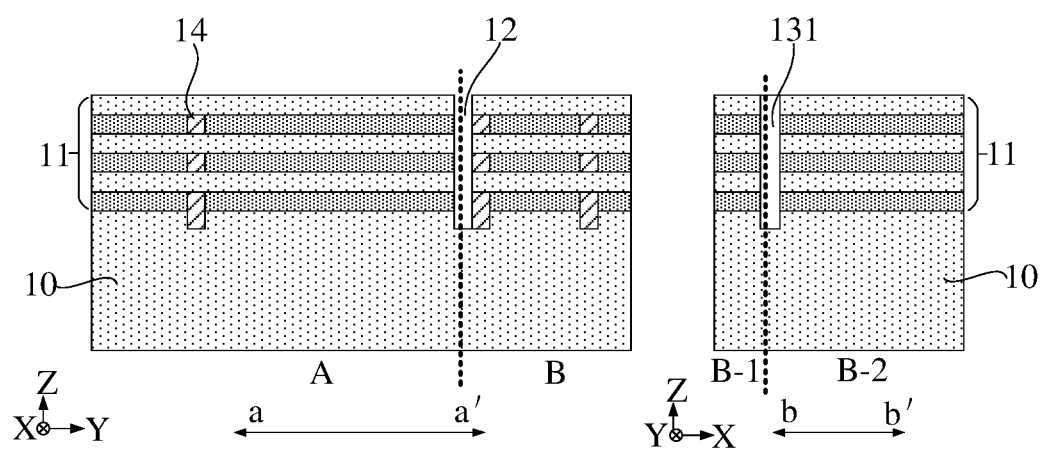
FIG. 2J illustrates a tenth schematic structural diagram in a process for forming a semiconductor structure according to embodiments of the disclosure.
Figure 2K:
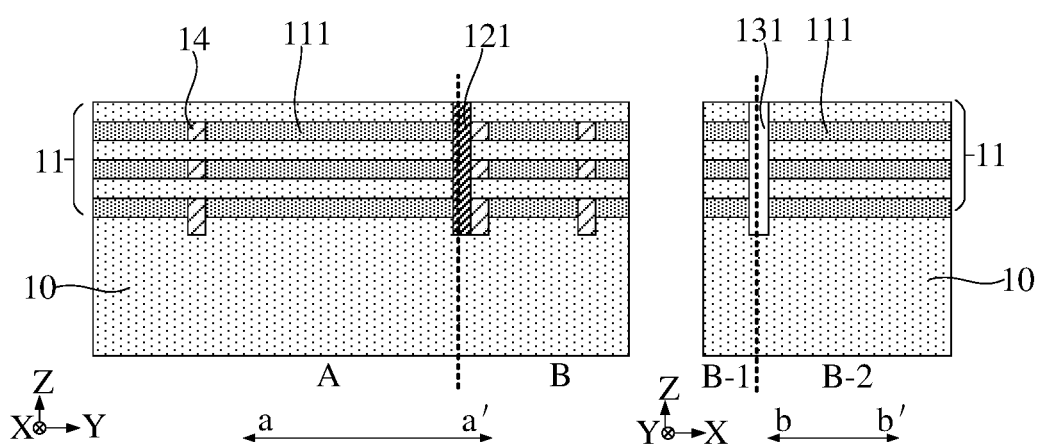
FIG. 2K illustrates an eleventh schematic structural diagram in a process for forming a semiconductor structure according to embodiments of the disclosure.
Figure 2L:
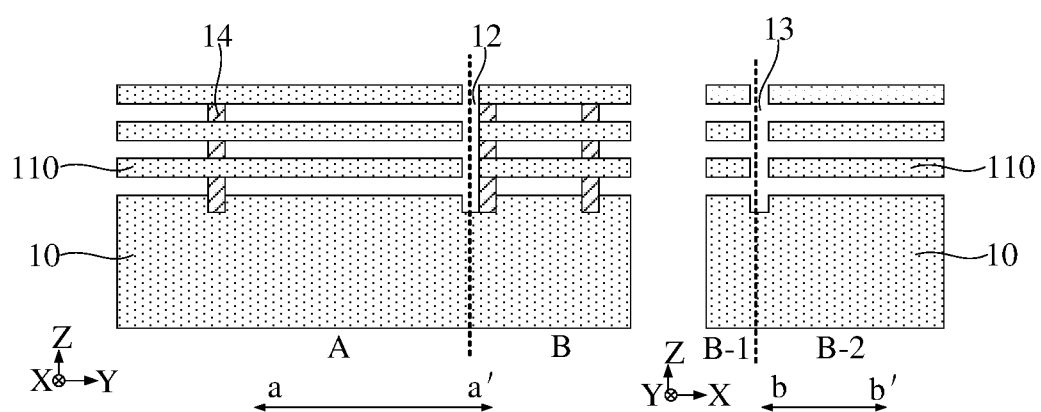
FIG. 2L illustrates a twelfth schematic structural diagram in a process for forming a semiconductor structure according to embodiments of the disclosure.
Figure 2M:
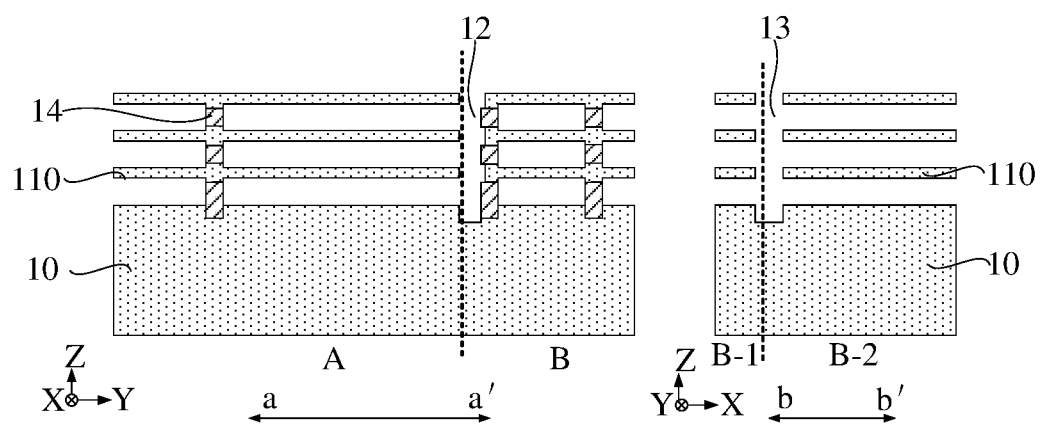
FIG. 2M illustrates a thirteenth schematic structural diagram in a process for forming a semiconductor structure according to embodiments of the disclosure.
Figure 2N:
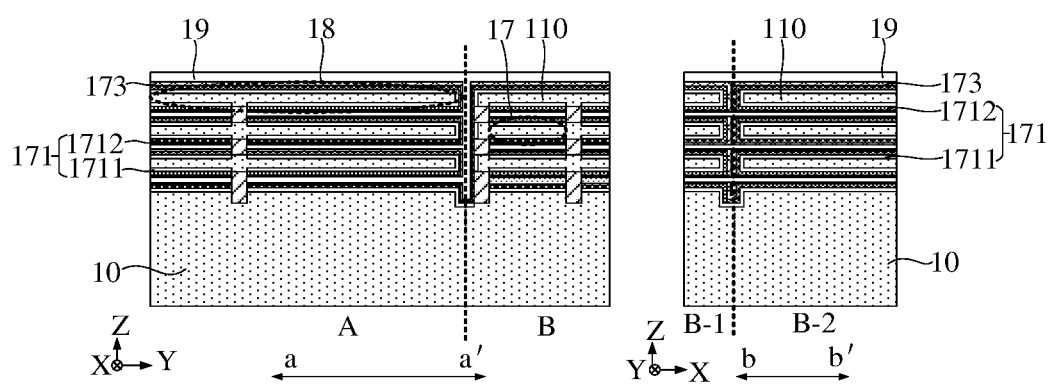
FIG. 2N illustrates a fourteenth schematic structural diagram in a process for forming a semiconductor structure according to embodiments of the disclosure.

First, S101 that a substrate is provided may be performed with reference to FIGS. 2A to 2N. The substrate includes a first isolation groove 12 extending in a first direction and a plurality of active columns 110 arranged in an array along the first direction and a third direction. The substrate is divided into a first area A and a second area B by the first isolation groove 12 along a second direction. The active columns 110 are supported through support structures 14.

In some embodiments, the forming the substrate includes: a semiconductor substrate 10 is provided. A stacked structure 11 is formed on the semiconductor substrate 10. The stacked structure 11 includes first semiconductor layers 111 and second semiconductor layers 112 stacked alternately. The stacked structure 11 is etched to form the first isolation groove 12. The first semiconductor layers 111 in the stacked structure 11 are removed.

As shown in FIG. 2A and FIG. 2B, the stacked structure 11 formed by stacking the first semiconductor layers 111 and second semiconductor layers 112 alternately is formed on the semiconductor substrate 10. The material of the first semiconductor layer 111 may be germanium, silicon germanide, or silicon carbide, or may also be a Silicon-On-Insulator (SOI) or a Germanium-on-Insulator (GOI). The second semiconductor layer 112 may be a silicon layer, or may also include other semiconductor elements such as germanium, or include semiconductor compounds such as silicon carbide, gallium arsenide, gallium phosphide indium phosphide, indium arsenide or indium antimonide, or include other semiconductor alloys such as silicon germanium, arsenic gallium phosphide, indium aluminum arsenide, gallium aluminum arsenide, indium gallium arsenide, indium gallium phosphide, and/or indium gallium arsenide phosphate, or a combination thereof.

In the embodiments of the disclosure, since the first semiconductor layer 111 needs to be etched and removed subsequently and the second semiconductor layer 112 needs to be remained, the first semiconductor layer 111 has higher etching selectivity than the second semiconductor layer 112. That is, under the same etching conditions, the first semiconductor layer 111 is more easily etched than the second semiconductor layer 112. For example, the first semiconductor layer 111 may be a silicon germanide layer, and the second semiconductor layer 112 may be a silicon layer.

In the embodiments of the disclosure, the first semiconductor layer 111 and the second semiconductor layer 112 may be formed through an epitaxy process. The first semiconductor layers 111 and the second semiconductor layers 112 may be stacked alternately to form a semiconductor superlattice. The thickness of each semiconductor layer varies from a few atoms to dozens of atomic layers, and the main semiconductor properties of each layer, such as a band gap and a doping level, can be independently controlled. The number of layers of the first semiconductor layers 111 and the second semiconductor layers 112 in the stacked structure 11 may be set according to the required capacitance density (or storage density). The greater the number of layers of the first semiconductor layers 111 and the second semiconductor layers 112, the higher the integration degree of the formed three-dimensional storage and the greater the capacitance density. For example, the number of layers of the first semiconductor layers 111 and the second semiconductor layers 112 may be 2 to 2000 layers.

In some embodiments, before forming the first isolation groove 12, the method for forming the semiconductor structure further includes: the stacked structure 11 and part of the semiconductor substrate 10 are etched to form a third isolation groove 13.

As shown in FIGS. 2C and 2D, the forming the third isolation groove 13 includes: firstly, a first mask layer 151, a first anti-reflection layer 311, and a first photoresist layer 161 with a specific pattern H are sequentially formed on a surface of the stacked structure 11. Secondly, the first anti-reflection layer 311 and the first mask layer 151 are etched sequentially through the first photoresist layer 161 to transfer the specific pattern H to the first mask layer 151. Finally, the stacked structure 11 and part of the semiconductor substrate 10 are etched through the first mask layer with the specific pattern H, so as to form the third isolation groove 13. In an embodiment of the disclosure, the bottom of the third isolation groove 13 is located in the semiconductor substrate 10. In other embodiments, the third isolation groove 13 may also be only located in the stacked structure 11 without extending into the semiconductor substrate 10.

In the embodiments of the disclosure, the first anti-reflection layer 311 is configured to absorb the light reflected from the surface of the stacked structure 11 to avoid the interference between reflected light and incident light. The material of the first anti-reflection layer 311 may be silicon oxynitride or a spin coated carbon layer. The material of the first mask layer 151 may be one or more of silicon oxide, silicon nitride, silicon carbide, or silicon oxynitride. Both the first mask layer 151 and the first anti-reflection layer 311 may be formed by any suitable deposition process.

In the embodiments of the disclosure, the second area B is divided into a first part B-1 and a second part B-2 by the third isolation groove 13 in the first direction. The first part B-1 may be configured to form a gate-all-around structure, and the second part B-2 may be configured to form a stepped word line structure.

In some embodiments, after the third isolation groove 13 is formed, the method for forming the semiconductor structure further includes: the first photoresist layer 161, the first anti-reflection layer 311, and the first mask layer 151 are removed. In the embodiments of the disclosure, the first photoresist layer 161, the first anti-reflection layer 311, and the first mask layer 151 may be removed by using a dry etching technology (such as a plasma etching technology, a reactive ion etching technology, or an ion milling technology) or a wet etching technology, so as to expose the surface of the stacked structure 11 (as shown in FIG. 2D).

FIG. 2E is a top view of the first area. As shown in FIG. 2E, after the third isolation groove 13 is formed and before the first isolation groove 12 is formed, the method for forming the semiconductor structure further includes: the stacked structure is etched to form a fifth isolation groove 31 extending in the second direction, the second semiconductor layers 112 are divided into a plurality of active columns 110 arranged in the first direction by the fifth isolation groove 31; and an isolation structure 310 is formed in the fifth isolation groove 31.

In the embodiments of the disclosure, the material for forming the isolation structure 310 may be silicon oxide, silicon nitride, or silicon oxynitride. The isolation structure 310 is configured to fill a gap between the adjacent active columns 110, so as to facilitate the subsequent formation of other structures between the active columns 110 and the isolation structure 310.

In some embodiments, after the isolation structure 310 is formed and before the first isolation groove 12 is formed, the method for forming the semiconductor structure further includes: part of the isolation structure 310 and part of the first semiconductor layers 111 are etched and removed to form a plurality of etched holes 141 extending in the first direction. The etched holes 141 expose the active columns 110. The etched holes 141 are filled with a support material to form support structures 14 surrounding the active columns 110.

In the embodiments of the disclosure, as shown in FIGS. 2F to 2H, the forming the support structures 14 includes: firstly, a second mask layer 152, a second anti-reflection layer 312, and a second photoresist layer 162 with a specific pattern I are sequentially formed on the surface of the stacked structure 11. The specific pattern I may be multiple openings extending in the X-axis direction. Secondly, the second anti-reflection layer 312 and the second mask layer 152 are etched sequentially through the second photoresist layer 162 to transfer the specific pattern I to the second mask layer 152. Thirdly, part of the isolation structure 310 and part of the first semiconductor layer 111 are etched and removed through the second mask layer with the specific pattern I to form a plurality of etched holes 141 extending in the X-axis direction. Finally, the etched holes 141 are filled with a support material to form support structures 14 surrounding the active columns 110. The material of the second mask layer 152 may be one or more of silicon oxide, silicon nitride, silicon carbide, or silicon oxynitride. The material of the second anti-reflection layer 312 may be silicon oxynitride or spin coated carbon. The support material may be silicon nitride or silicon carbonitride.

In the embodiments of the disclosure, the support structure(s) 14 may also extend into the semiconductor substrate 10 to achieve a more stable support effect.

In the embodiments of the disclosure, the support structures 14 may be configured to support the active columns 110. A capacitor structure and a gate-all-around structure will be formed between adjacent active columns 110 subsequently. Therefore, the support structures 14 may also be configured to support the capacitor structure and the gate-all-around structure, so that the stability of the formed semiconductor structure is improved.

In some embodiments, after the etched holes 141 are formed, the method for forming the semiconductor structure further includes: the second photoresist layer 162, the second anti-reflection layer 312, and the second mask layer 152 are removed. During implementation, the second photoresist layer 162, the second anti-reflection layer 312, and the second mask layer 152 may be removed by using a dry etching technology or a wet etching technology to expose the surface of the stacked structure 11 (as shown in FIG. 2H).

As shown in FIGS. 2I and 2J, the forming the first isolation groove 12 includes: firstly, a third mask layer 153 and a third photoresist layer 163 with a specific pattern C are sequentially formed on the surface of the stacked structure 11. The specific pattern C may be an opening extending in the X-axis direction. The projection of the specific pattern C on the semiconductor substrate 10 is adjacent to the projection of one of the specific pattern I on the semiconductor substrate 10 in the Y-axis direction. Secondly, the third mask layer 153 is etched through the third photoresist layer 163 to transfer the specific pattern C to the third mask layer 153. The stacked structure 11 and the isolation structure 310 are etched through the third mask layer with the specific pattern C to form the first isolation groove 12. The first isolation groove 12 exposes adjacent support structures 14. In the embodiments of the disclosure, the first isolation groove 12 extends into the semiconductor substrate 10 to achieve a better isolating effect.

In the embodiments of the disclosure, the substrate is divided into the first area A and the second area B by the first isolation groove 12 in the Y-axis direction. The first area A is configured to form a capacitor structure. The second area B is configured to form a gate-all-around structure, a bit line structure, and a stepped word line structure.

In other embodiments, the first isolation groove 12 may also be only located on the surface of the semiconductor substrate 10.

In the embodiments of the disclosure, after the first isolation groove 12 is formed, the method for forming the semiconductor structure further includes: the third mask layer 153 and the third photoresist layer 163 are removed. During implementation, the third mask layer 153 and the third photoresist layer 163 may be removed by using a dry etching technology or a wet etching technology.

In some embodiments, as shown in FIG. 2K, after the first isolation groove 12 is formed, the method for forming the semiconductor structure further includes: the first isolation groove 12 is filled with a sacrificial material to form a sacrificial layer 121.

In the embodiments of the disclosure, the sacrificial layer 121 may be silicon oxynitride. The sacrificial layer 121 is configured to protect a cross section of the second semiconductor layer 112 from being damaged in subsequent removal of the first semiconductor layer 111, so as to facilitate subsequent epitaxial formation of a connecting structure for connecting a gate-all-around structure and a stepped word line structure on a cross section of the second semiconductor layer 112.

As shown in FIG. 2L, the first semiconductor layer 111 in the stacked structure 11 is removed.

In the embodiments of the disclosure, the first semiconductor layer 111 in the stacked structure 11 may be removed by using a wet etching technology (for example, etching by using strong acids such as concentrated sulfuric acid, hydrofluoric acid, or concentrated nitric acid) or a dry etching technology. The first semiconductor layer 111 has higher etching selectivity relative to the second semiconductor layer 112, so that the second semiconductor layer 112 cannot be damaged when the first semiconductor layer 111 is removed.

In some embodiments, continuing to refer to FIG. 2L, after the first semiconductor layer 111 is removed, the method for forming the semiconductor structure further includes: the sacrificial layer 121, a protective layer 131, and the isolation structure 310 are removed. For example, the sacrificial layer 121, the protective layer 131, and the isolation structure 310 may be removed by using a wet etching technology.

In some embodiments, as shown in FIG. 2M, the method for forming the semiconductor structure further includes: a thinning process is performed on the active columns 110. In the embodiments of the disclosure, the thinning process is performed on the active columns 110, so that a gap between two adjacent active columns 110 becomes larger. On one hand, the effective area of the capacitor structure can be enlarged, so as to improve the capacity of the capacitor structure. On the other hand, a large space may be reserved for subsequent formation of the capacitor structure and the gate-all-around structure, so that the process complexity is reduced.

In the embodiments of the disclosure, the thinning process may be performed on the active columns 110 by the following two methods.

Method 1: dry etching is directly performed on the active columns 110, and the etching is stopped until the required thickness is formed.

Method 2: the active columns 110 are oxidized in situ to oxidize part of the active columns 110 into silicon oxide layers, and the silicon oxide layers are removed by using the wet etching or dry etching technology.

It is to be noted that, in other embodiments, no thinning process may be performed on the active columns 110.

Next, S102 that semi-capacitor structures 18 located in the first area A and gate-all-around structures 17 located in the second area B are formed in the gaps between the active columns 110 may be performed with reference to FIG. 2N.

In some embodiments, the forming the semi-capacitor structures 18 and the gate-all-around structures 17 includes: a medium layer 171 and a first metal layer 173 are sequentially formed on surfaces of the active columns 110 in the first area A and the second area B.

In some embodiments, there may be one or more medium layers 171. For example, the medium layer 171 in the embodiments of the disclosure may include a first medium layer 1711 and a second medium layer 1712. The material of the first medium layer 1711 may be silicon oxide or other suitable materials. The material of the second medium layer 1712 may be a high-K material, such as one or a combination of lanthanum oxide, aluminum oxide, hafnium oxide, hafnium oxynitride, niobium oxide, hafnium silicate, or zirconia. The material of the first metal layer may be a material with good conductivity, such as titanium nitride.

In the embodiments of the disclosure, when the second medium layer 1712 can serve as a dielectric layer of the capacitor structure, the second medium layer 1712 and the first metal layer 173 located in the first area A constitute the semi-capacitor structure 18. In other embodiments, when the second medium layer 1712 cannot serve as a dielectric layer of the capacitor structure, the semi-capacitor structure 18 includes the first metal layer 173. The first medium layer 1711, the second medium layer 1712, and the first metal layer 173 located in the second area B constitute the gate-all-around structure 17.

In the embodiments of the disclosure, the first medium layer 1711, the second medium layer 1712, and the first metal layer 173 may be formed by any one of the following deposition processes: a Chemical Vapor Deposition (CVD) process, a Physical Vapor Deposition (PVD) process, an Atomic Layer Deposition (ALD) process, a spin coating process, a coating process, a thin film process or the like.

In the embodiments of the disclosure, the first metal layer 173 located in the first area A constitutes a lower electrode layer of the capacitor structure. The medium layer 171 and the first metal layer 173 located in the second area B respectively constitute a gate medium layer and a gate metal layer of the gate-all-around structure 17. Since the gate-all-around structure 17 and the lower electrode layer of the capacitor structure are formed at the same time in the embodiments of the disclosure, a process for preparing the semiconductor structure can be simplified, and the manufacturing cost of the semiconductor structure can be reduced.

In the embodiments of the disclosure, the gate-all-around structure 17 has a wide channel area, so that a short channel effect can be reduced, and the control capacity of a gate electrode can further be improved, thereby improving the performance of the formed semiconductor structure.

It is to be noted that the medium layer 171 and the first metal layer 173 are also formed on inner walls of the first isolation groove 12 and the third isolation groove 13 while forming the gate-all-around structure 17 and the semi-capacitor structure 18.

Continuing to refer to FIG. 2N, after the first metal layer 173 is formed, the method for forming the semiconductor structure further includes: a first isolation material is filled on the surface of the first metal layer 173 and into the gap of the first metal layers 173 to form a first isolation layer 19.

In the embodiments of the disclosure, the first isolation layer 19 may be configured to isolate adjacent first metal layers 173, to prevent the first metal layer 173 from electric leakage. The first isolation material may be silicon oxide, silicon nitride, silicon oxynitride or other suitable materials.

Figure 3A:
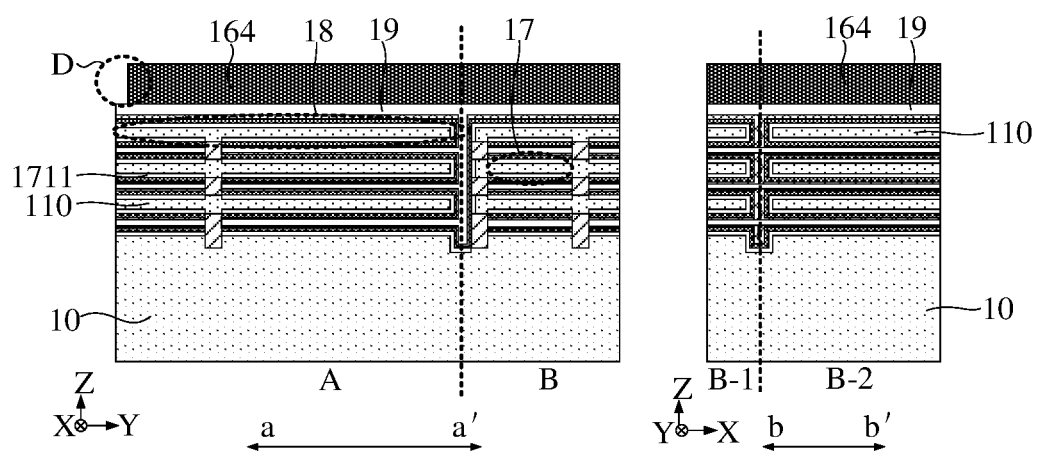
FIG. 3A illustrates a fifteenth schematic structural diagram in a process for forming a semiconductor structure according to embodiments of the disclosure.
Figure 3B:
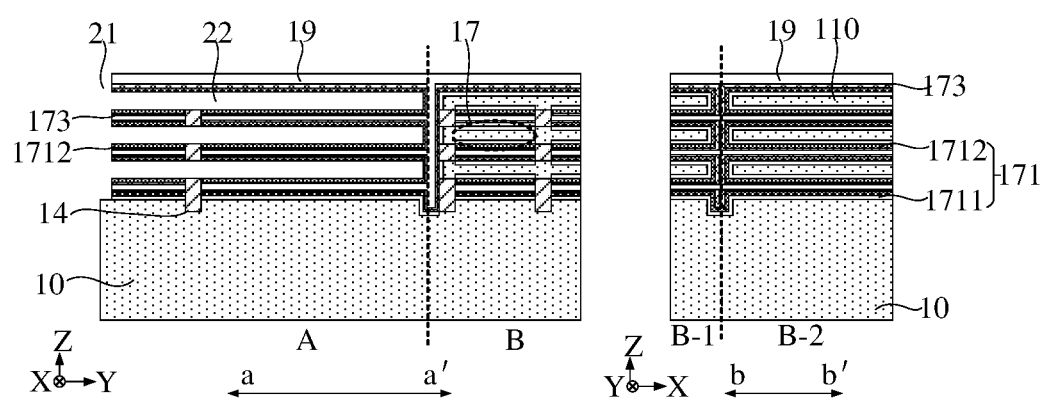
FIG. 3B illustrates a sixteenth schematic structural diagram in a process for forming a semiconductor structure according to embodiments of the disclosure.
Figure 3C:
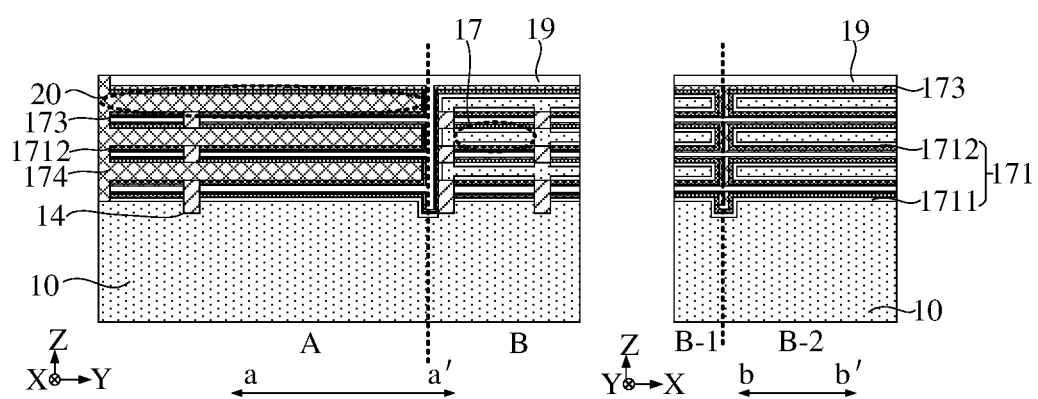
FIG. 3C illustrates a seventeenth schematic structural diagram in a process for forming a semiconductor structure according to embodiments of the disclosure.

Next, S103 that the active columns 110 and the semi-capacitor structures in the first area A are processed to form the capacitor structures 20 extending in the second direction may be performed with reference to FIGS. 3A to 3C.

In some embodiments, when the second medium layer 1712 can serve as a dielectric layer of the capacitor structure 20, S103 may include the following steps: as shown in FIGS. 3A to 3C, a first opening 21 extending in the X-axis direction is formed in the first area A; the first opening 21 exposes the semiconductor substrate 10; the active column 110 and the first medium layer 1711 in the first area A are removed through the first opening 21, so as to form a first gap 22; and a second metal material is deposited in the first opening 21 and the first gap 22 to form a second metal layer 174.

In other embodiments, when the second medium layer 1712 cannot serve as the dielectric layer of the capacitor structure 20, S103 may also include the following steps: the first opening 21 extending in the X-axis direction is formed in the first area A; the first opening 21 exposes the semiconductor substrate 10; the active column 110 and the medium layer 171 in the first area A are removed through the first opening 21, so as to form a first gap 22; and a dielectric material and a second metal layer are sequentially formed in the first opening 21 and the first gap 22 to form a dielectric layer 172 and the second metal layer 174. At this moment, the second metal layer 174 constitutes an upper electrode of the capacitor structure 20. The first metal layer 173, the dielectric layer 172, and the second metal layer 174 located in the first area A constitute the capacitor structure 20.

In some embodiments, continuing to refer to FIGS. 3A and 3B, the forming the first opening 21 includes: a fourth photoresist layer 164 with a specific pattern D is formed on a surface of the first isolation layer 19. At this moment, the first isolation layer 19 may serve as a mask layer of the first opening 21. The first isolation layer 19 is etched through the fourth photoresist layer 164, so as to transfer the specific pattern D into the first isolation layer 19. The stacked structure 11 is etched through the first isolation layer 19 with the specific pattern D until the semiconductor substrate 10 is exposed to form the first opening 21.

In the embodiments of the disclosure, the material of the dielectric layer may be a high-K dielectric, for example, one or any combination of lanthanum oxide ($La_2O_3$), aluminum oxide ($Al_2O_3$), hafnium oxide ($HfO_2$), hafnium oxynitride (HfON), niobium oxide (NbO), hafnium silicate ($HfSiO_x$) or zirconium oxide ($ZrO_2$). The second metal material may include titanium, tungsten, molybdenum, metal nitride, or metal silicide. The dielectric material and the second metal material may be formed by any deposition process.

Figure 3D:
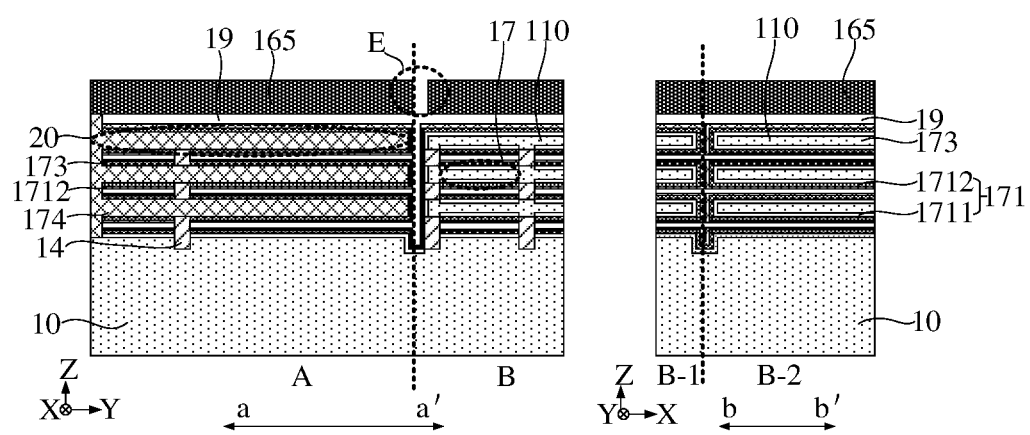
FIG. 3D illustrates an eighteenth schematic structural diagram in a process for forming a semiconductor structure according to embodiments of the disclosure.
Figure 3E:
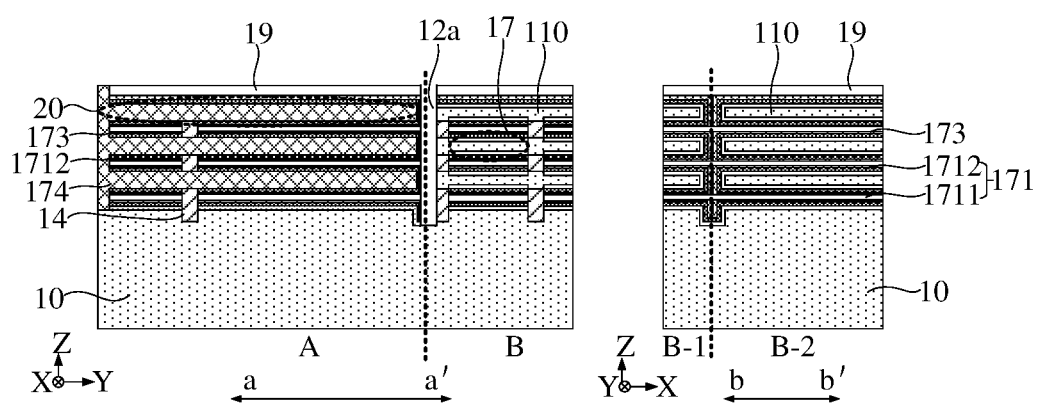
FIG. 3E illustrates a nineteenth schematic structural diagram in a process for forming a semiconductor structure according to embodiments of the disclosure.
Figure 3F:
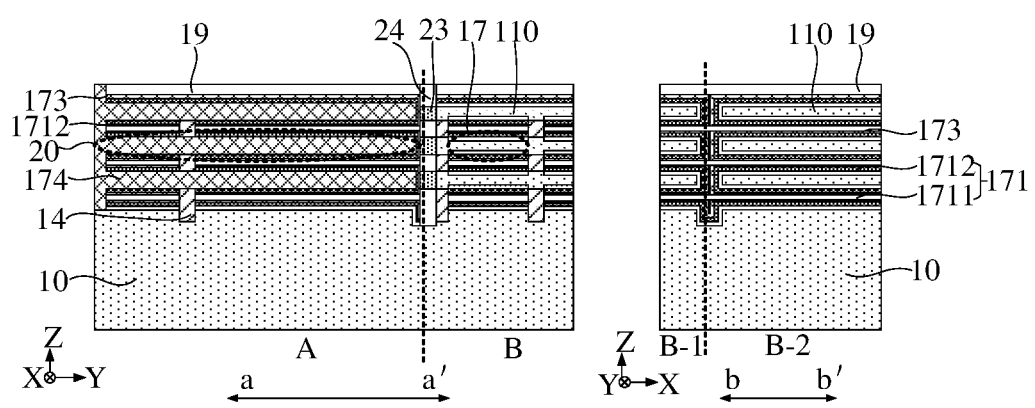
FIG. 3F illustrates a twentieth schematic structural diagram in a process for forming a semiconductor structure according to embodiments of the disclosure.

Finally, S104 that first connecting structures 23 connecting the gate-all-around structures 17 and the capacitor structures 20 are formed in the first isolation groove 12 may be performed with reference to FIG. 3D to 3F.

In some embodiments, the forming the first connecting structure 23 includes: the first isolation layer 19 located in the first isolation groove 12 is removed, and the medium layer 171 and the first metal layer 173 located on a side wall of the second area B in the first isolation groove 12 are removed, so as to form a second isolation groove 12a extending in the first direction. The second isolation groove 12a exposes the active columns 110 in the second area B and the first metal layer 173 on a side wall of the first area A; the first connecting structure 23 is epitaxially grown on a surface of the exposed active column 110. The first connecting structure 23 is in contact with the first metal layer 173 in the first area.

As shown in FIGS. 3D to 3F, the forming the first connecting structure 23 includes: a fifth photoresist layer 165 with a specific pattern E is formed on the surface of the first isolation layer 19. At this moment, the first isolation layer 19 can serve as a mask layer for forming the second isolation groove 12a. The first isolation layer 19 is etched through the fifth photoresist layer 165 to transfer the specific pattern E into the first isolation layer 19. The first isolation layer 19, the medium layer 171, and the first metal layer 173 located in the first isolation groove 12 are etched and removed through the first isolation layer with the specific pattern E to form the second isolation groove 12a extending along the X-axis direction. The second isolation groove 12a exposes the active columns 110 in the second area B and the first metal layer 173 on the side wall of the first area A. A first semiconductor material is epitaxially grown on the surface of the exposed active column 110 to form the first connection structure 23. The first connecting structure 23 is in contact with the first metal layer 173 in the first area A.

In the embodiments of the disclosure, the first connecting structure 23 may be a heteroepitaxial layer. Therefore, the first semiconductor material may be silicon germanium. The content of germanium in the silicon germanium may be 5% to 50%. The thickness of the first connecting structure 23 is 20 to 200 Å.

In the embodiments of the disclosure, the epitaxial growth may be vapor phase epitaxy, liquid phase epitaxy, molecular beam epitaxy, or metal organic chemical vapor deposition. Self-aligned connection of the gate-all-around structure 17 and the capacitor structure 20 can be realized by using the selectivity of an epitaxy growth process.

Continuing to refer to FIG. 3F, after the first connecting structure 23 is formed, the method for forming the semiconductor structure further includes: the second isolation groove 12a and a gap between the first connecting structures 23 are filled with a second isolation material to form a second isolation layer 24. A surface of the second isolation layer 24 is flush with a surface of the first isolation layer 19.

In the embodiments of the disclosure, the second isolation layer 24 may be configured to isolate adjacent first connecting structures 23. The material of the second isolation layer 24 may be silicon oxide, silicon nitride, silicon oxynitride or other suitable materials.

In some embodiments, referring to FIGS. 3G to 3M, after the second isolation layer 24 is formed, the method for forming the semiconductor structure further includes: a bit line structure 25 and a stepped word line structure 26 connected to the gate-all-around 17 are formed.

In some embodiments, the forming the bit line structure 25 includes: one end, far away from the capacitor structure 20, of the active column 110 is etched to form a bit line trench extending in first direction, herein the bit line trench exposes the semiconductor substrate 10 in the second area; and the bit line trench is filled with a bit line metal material to form the bit line structure 25.

Figure 3G:
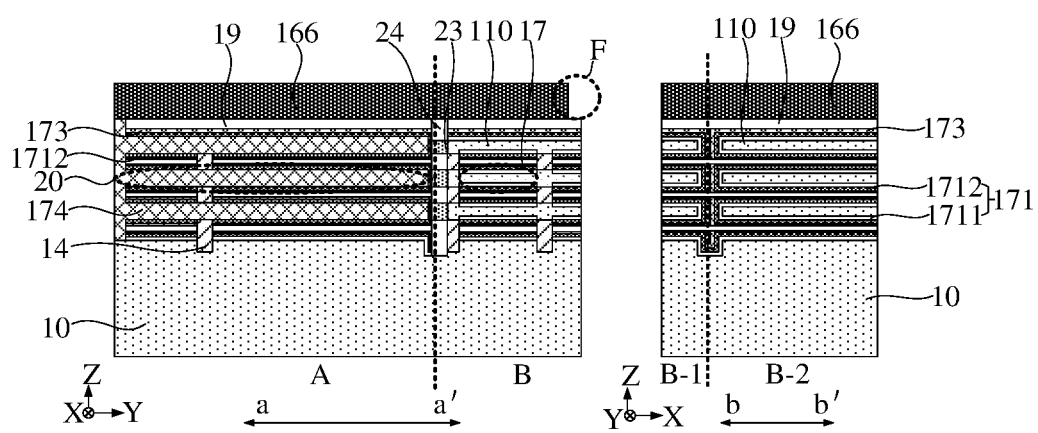
FIG. 3G illustrates a twenty first schematic structural diagram in a process for forming a semiconductor structure according to embodiments of the disclosure.
Figure 3H:
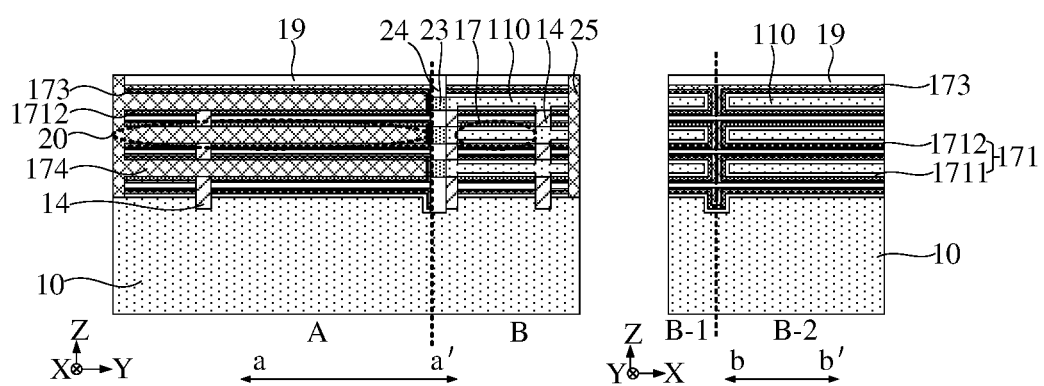
FIG. 3H illustrates a twenty second schematic structural diagram in a process for forming a semiconductor structure according to embodiments of the disclosure.

As shown in FIGS. 3G and 3H, a sixth photoresist layer 166 with a specific pattern F is formed on the surface of the first isolation layer 19. At this moment, the first isolation layer 19 and the second isolation layer 24 may serve as mask layers for forming the bit line trench. The first isolation layer 19 is etched through the sixth photoresist layer 166, so as to transfer the specific pattern F into the first isolation layer 19. One end, far away from the capacitor structure 20, of the active column 110 is etched through the first isolation layer 19 with the specific patter F, so as to form a bit line trench (not shown) extending in the X-axis direction. The bit line trench exposes the semiconductor substrate 10 in the second area B. The bit line trench is filled with a bit line metal material to form the bit line structure 25.

In the embodiments of the disclosure, the bit line metal material includes: tungsten (W), cobalt (Co), copper (Cu), aluminum (Al), titanium nitride (TiN), titanium containing metal layer, polycrystalline silicon, or any combination thereof.

In some embodiments, the relationships among the bit line structure 25, the gate-all-around structure 17, and the support structure 14 may include the following two conditions: the first one is that the support structure 14 is located in the center of the gate-all-around structure 17, and the gate-all-around structure 17 is in contact with the bit line structure 25, as shown in FIG. 3H; and the second one is that the support structure 14 is located at one end, far away from the capacitor structure, of the gate-all-around structure (that is, located at the rightmost end of the gate-all-around structure 17). At this moment, the support structure is in contact with the bit line structure 25, and the bit line structure 25 and the gate-all-around structure 17 are spaced through the support structures 14.

In some embodiments, before the stepped word line structure 26 is formed, the method for forming the semiconductor structure further includes: the first isolation layer 19, the medium layer 171, and the first metal layer 173 located in the third isolation groove 13 are removed to form a fourth isolation groove 13a extending in the second direction. The fourth isolation groove 13a exposes the first metal layer 173 of the first part and the active column 110 of the second part. A second connecting structure 27 connecting the second part and the gate-all-around structure 17 is formed in the fourth isolation groove 13a.

Figure 3I:
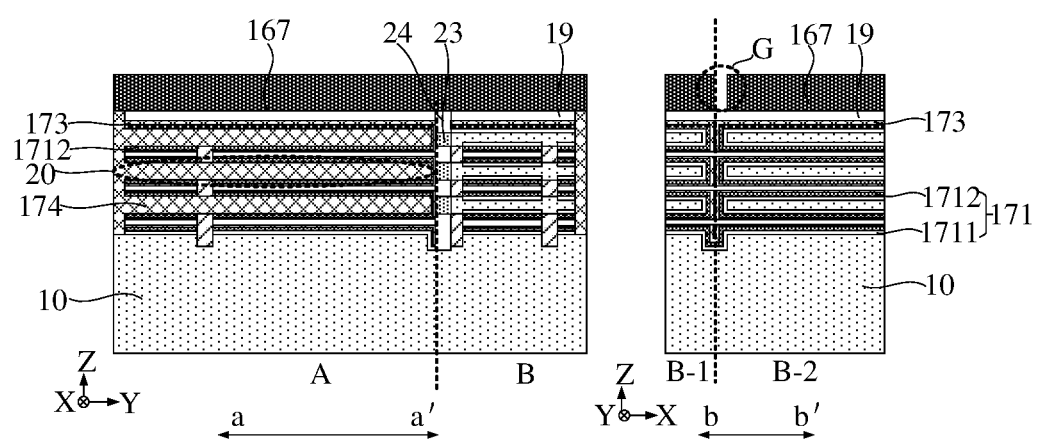
FIG. 3I illustrates a twenty third schematic structural diagram in a process for forming a semiconductor structure according to embodiments of the disclosure.
Figure 3J:
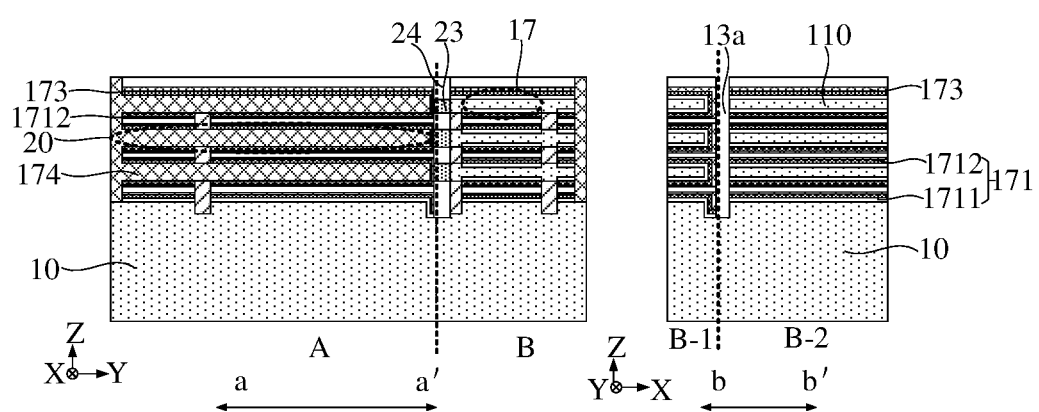
FIG. 3J illustrates a twenty fourth schematic structural diagram in a process for forming a semiconductor structure according to embodiments of the disclosure.

In some embodiments, as shown in FIGS. 3I to 3J, the forming the fourth isolation groove 13a includes: a seventh photoresist layer 167 with a specific pattern G is formed on the surface of the first isolation layer 19. At this moment, the first isolation layer 19 and the second isolation layer 24 can serve as mask layers for forming the fourth isolation groove 13a. The first isolation layer 19 is etched through the seventh photoresist layer 167 to transfer the specific pattern G into the first isolation layer 19. The first isolation layer 19 located in the third isolation groove 13 and the medium layer 171 and the first metal layer 173 located on the side wall of the second part B-2 in the third isolation groove 13 are etched and removed through the first isolation layer 19 with the specific pattern G to form the fourth isolation groove 13a extending along the Y-axis direction. The fourth isolation groove 13a exposes the first metal layer 173 on the side wall of the first part B-1 and the active columns 110 of the second part B-2.

Figure 3K:
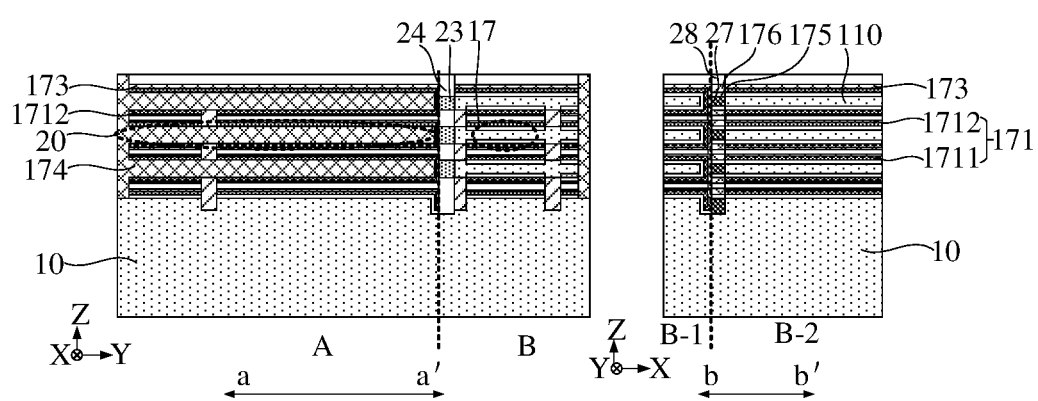
FIG. 3K illustrates a twenty fifth schematic structural diagram in a process for forming a semiconductor structure according to embodiments of the disclosure.

In the embodiments of the disclosure, the fourth isolation groove 13a is configured to form the second connecting structure 27 connecting the second part B-2 and the gate-all-around structure 17. As shown in FIG. 3K, the forming the second connecting structure 27 includes: the second semiconductor material is epitaxially grown on a surface of the exposed active column 110 in the second part B-2 to form the second connecting structure 27. The second connecting structure 27 is in contact with the first metal layer 173 in the first part B-1.

In the embodiments of the disclosure, the second connecting structure 27 may be a homogeneity epitaxy layer. Therefore, the second semiconductor material may be silicon. The thickness of the second connecting structure 27 is 20 to 200 Å.

In the embodiments of the disclosure, the epitaxial growth may be vapor phase epitaxy, liquid phase epitaxy, molecular beam epitaxy, or metal organic chemical vapor deposition.

In some embodiments, continuing to refer to FIG. 3K, after the second connecting structure 27 is formed, the method for forming the semiconductor structure further includes: an insulating medium layer 175 is formed on a surface of the second connecting structure 27. A surface of the insulating medium layer 175 is flush with a surface of the medium layer 171. A third metal layer 176 is formed on the surface of the insulating medium layer 175. A surface of the third metal layer 176 is flush with a surface of the first metal layer 173. A third isolation material is filled on the surface of the third metal layer 176 and into the gap of the third metal layers 176 to form a third isolation layer 28. A surface of the third isolation layer 28 is flush with the surface of the first isolation layer 19.

In the embodiments of the disclosure, the material of the insulating medium layer 175 may be silicon oxide, silicon nitride, or silicon oxynitride, for example, silicon oxide. The third isolation layer 28 may be configured to isolate adjacent third metal layers 176 to prevent the third metal layer 176 from electric leakage. The material of the third isolation layer 28 may be silicon oxide, silicon nitride, silicon oxynitride, or other suitable materials. The material of the third metal layer 176 may be any material with good electrical conductivity, such as tungsten.

In some embodiments, the gate-all-around structure 17 is divided into a first part B-1 and a second part B-2 by the third isolation groove 13 in the X-axis direction. The forming the stepped word line structure 26 includes: a photoresist layer with a second opening is formed on a surface of the second part; the second opening exposes one end, far away from the first part, of the second part. The second part is etched for a plurality of times by the photoresist layer to form the stepped word line structure 26. During etching for the plurality of times, the size of the second opening in the first direction increases sequentially.

In some embodiments, the forming the stepped word line step 26 includes: firstly, a photoresist layer with a second opening is formed on a surface of the second part B-2. The second opening exposes one end, far away from the first part, of the second part. The second part B-2 is etched through the photoresist layer with the second opening to form a first stepped structure. The first stepped structure includes one step. Secondly, a photoresist layer with a third opening is formed on a surface of the first stepped structure; the third opening exposes part of the first stepped structure; the first stepped structure is etched by the photoresist layer with the third opening to form a second stepped structure. The second stepped structure includes two steps. The size of the third opening in the X-axis direction is greater than the size of the second opening. Thirdly, a photoresist layer with a fourth opening is formed on a surface of the second stepped structure. The fourth opening exposes part of the second stepped structure. The second stepped structure is etched by the photoresist layer with the fourth opening to form a third stepped structure. The third stepped structure includes three steps. The size of the fourth opening in the X-axis direction is greater than the size of the third opening. The abovementioned steps are cycled, and the stepped word line structure 26 is finally formed after a plurality of etching processes.

Figure 3L:
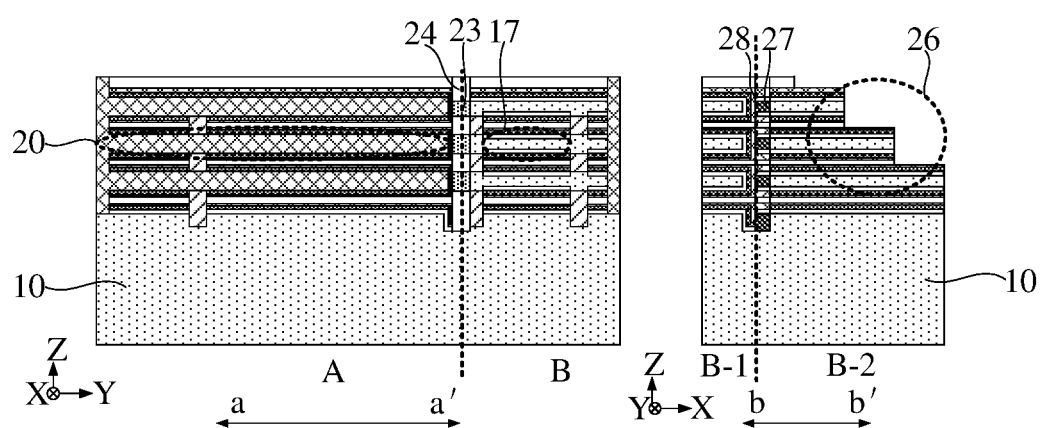
FIG. 3L illustrates a twenty sixth schematic structural diagram in a process for forming a semiconductor structure according to embodiments of the disclosure.

As shown in FIG. 3L, in the embodiments of the disclosure, the stepped word line structure 26 extending in the X-axis direction is formed on the semiconductor substrate 10. The stepped word line structure 26 has a length reduced layer by layer from bottom to top in the Z-axis direction.

In other embodiments, the forming the stepped word line structure 26 may also include: firstly, a first word line with a first length is formed on a base substrate surface of the second part B-2. The first word line is electrically connected to a first layer of gate-all-around structure 17 at the bottommost layer in the third direction. Secondly, a first isolation unit with a second length is formed on a surface of the first word line. A second word line with a second length is formed on a surface of the first isolation unit. The second word line is electrically connected to a second layer of gate-all-around structure 17 at the sub-bottom layer in the third direction. The first length is greater than the second length. The first isolation unit is configured to isolate adjacent first word line and second word line. Thirdly, a second isolation unit with a third length is formed on a surface of the second word line. A third word line with the third length is formed on a surface of the second isolation unit. The third word line is electrically connected to a third layer of gate-all-around structure 17 in the third direction from bottom to top. The second length is greater than the third length. The second isolation unit is configured to isolate adjacent second word line and third word line. The abovementioned steps are cycled, and the stepped word line structure 26 composed of a plurality of word lines are formed after a plurality of forming processes.

In some embodiments, after the stepped word line structure 26 is formed, the method for forming the semiconductor structure further includes: a first metal wire 291 connected to the capacitor structure 20, a second metal wire 292 connected to the bit line structure 25, and a third metal wire 293 connected to the stepped word line structure 26 are formed.

Figure 3M:
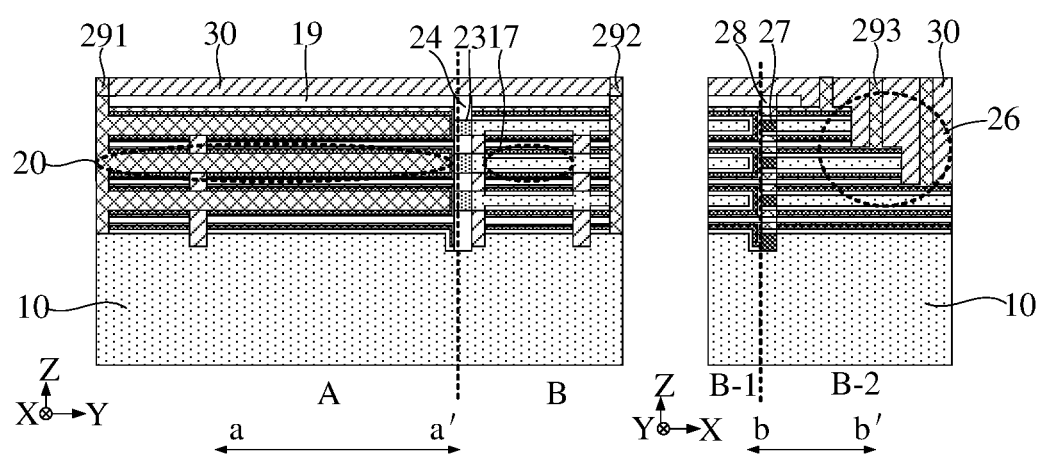
FIG. 3M illustrates a twenty seventh schematic structural diagram in a process for forming a semiconductor structure according to embodiments of the disclosure.

In some embodiments, as shown in FIG. 3M, the forming the first metal wire 291, the second metal wire 292, and the third metal wire 293 includes: a barrier layer 30 is formed on the surfaces of the stepped word line structure 26, the first isolation layer 19, the second isolation layer 24, and the third isolation layer 28; the barrier layer 30 is etched to form a first through hole (not shown) exposing the second metal layer 174, a second through hole (not shown) exposing the bit line structure 25, and a third through hole (not shown) exposing the stepped word line structure 26. The first metal wire 291 connected with the capacitor structure 20 is formed in the first through hole, the second metal wire 292 connected with the bit line structure 25 is formed in the second through hole, and the third metal wire 293 connected with the stepped word line structure 26 is formed in the third through hole.

In the embodiments of the disclosure, the materials of the first metal wire 291, the second metal wire 292, and the third metal wire 293 may be composed of any conductive metal material, such as titanium nitride. In other embodiments, the materials of the first metal wire 291, the second metal wire 292, and the third metal wire 293 may also be copper, aluminum, copper aluminum alloy, tungsten, or other conductive metals.

In the embodiments of the disclosure, the gate-all-around structure and the semi-capacitor structure are formed at the same time, so that a process for preparing the semiconductor structure can be simplified, and the manufacturing cost of the semiconductor structure can be reduced. In addition, since the capacitor structure in the embodiments of the disclosure extends in the second direction, that is, the capacitor structure in the embodiments of the disclosure is horizontal. Compared with a vertical capacitor structure with a large aspect ratio, the horizontal capacitor structure can reduce the possibility of tipping or breaking, so that the stability of the capacitor structure can be improved. Moreover, the stacked structure formed by stacking a plurality of capacitor structures in the third direction can form a three-dimensional semiconductor structure, so as to improve the integration degree of the semiconductor structure and realize miniaturization.

Figure 4:
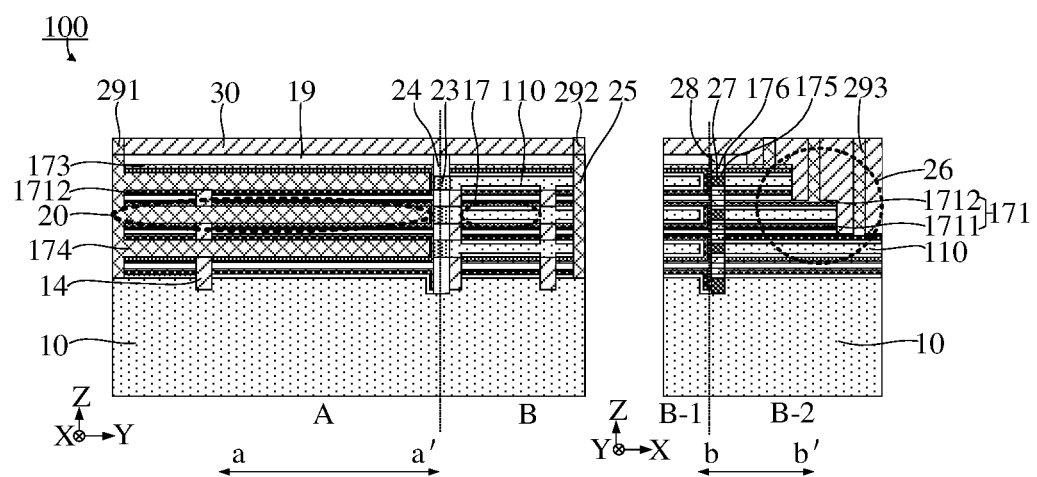
FIG. 4 illustrates a sectional view of a semiconductor structure according to an embodiment of the disclosure.

In addition, the embodiments of the disclosure further provide a semiconductor structure. FIG. 4 illustrates a sectional view of the semiconductor structure according to an embodiment of the disclosure, as shown in FIG. 4, the semiconductor structure 100 includes: a substrate. The substrate includes a first area A and a second area B arranged in a Y-axis direction. The second area B includes a first part B-1 and a second part B-2 arranged in an X-axis direction. The second area B includes active columns 110 arranged in an array in the X-axis direction and a Z-axis direction. The semiconductor structure 100 further includes: capacitor structures 20 located in the first area A and extending in the Y-axis direction, and gate-all-around structures 17 located in the second area B. The gate-all-around structures 17 surround surfaces of the active columns 110.

In some embodiments, the capacitor structure 20 includes a first metal layer 173, a second medium layer 1712, and a second metal layer 174. The gate-all-around structure 17 includes a medium layer 171 and a first metal layer 173. The medium layer 171 includes a first medium layer 1711 and a second medium layer 1712.

In the embodiments of the disclosure, the gate-all-around structure 17 has a wide channel area, so that a short channel effect can be reduced, and the control capacity of a gate electrode can further be improved, thereby improving the performance of the formed semiconductor structure.

In some embodiments, the semiconductor structure 100 further includes: first isolation layers 19 located between adjacent first metal layers 173 and located on surfaces of the first metal layers 173. The first isolation layers 19 are configured to isolate adjacent first metal layers 173 to prevent the first metal layers 173 from electric leakage.

In some embodiments, the semiconductor structure 100 further includes: first connecting structures 23 connecting the capacitor structures 20 and the gate-all-around structures 17, and support structures 14 configured to support the capacitor structures 20 and the gate-all-around structures 17. The support structure 14 is embedded into the semiconductor substrate 10 to achieve a more stable support effect.

In some embodiments, the semiconductor structure 100 further includes: a bit line structure 25 located in the second area B and extending in the first direction.

In some embodiments, the semiconductor structure 100 further includes: a second connecting structure 27 and a stepped word line structure 26. The gate-all-around structure 17 is connected to the stepped word line structure 26 through the second connecting structure 27.

In some embodiments, the semiconductor structure 100 further includes: first isolation layers 19 located between first metal layers 173 and located on the surfaces of the first metal layers 173. The first isolation layers 19 are configured to isolate adjacent first metal layers 173.

In some embodiments, the semiconductor structure 100 further includes: a second isolation layer 24 located between adjacent first connecting structures 23. The second isolation layer 24 is configured to isolate adjacent first connecting structures 23.

In some embodiments, the semiconductor structure 100 further includes: a second isolation layer 24 located between adjacent second connecting structures 27. The second isolation layer 24 is configured to isolate adjacent second connecting structures 27.

In some embodiments, the semiconductor structure 100 further includes: an insulating medium layer 175 located on a surface of the second connecting structure 27. A surface of the insulating medium layer 175 is flush with a surface of the medium layer 171.

In some embodiments, the semiconductor structure 100 further includes: a third metal layer 176 located on the surface of the insulating medium layer 175. A surface of the third metal layer 176 is flush with the surface of the first metal layer 173.

In some embodiments, the semiconductor structure 100 further includes: third isolation layers 28 located between third metal layers 176 and on the surfaces of the third metal layers 176. The third isolation layers 28 are configured to isolate adjacent third metal layers 176.

In some embodiments, the semiconductor structure 100 further includes: a first metal wire 291, a second metal wire 292, and a third metal wire 293. The first metal wire 291 is located on a surface of the capacitor structure 20 and is electrically connected with the capacitor structure 20. The second metal wire 292 is located on a surface of the bit line structure 25 and is electrically connected with the bit line structure 25. The third metal wire 293 is located on a surface of the stepped word line structure 26 and is electrically connected with the stepped word line structure 26.

In some embodiments, the semiconductor structure 100 further includes: a barrier layer 30. The first metal wire 291, the second metal wire 292, and the third metal wire 293 are located in the barrier layer 30.

The semiconductor structure according to the embodiments of the disclosure is similar to the method for forming the semiconductor structure provided by the abovementioned embodiments. The technical features not disclosed in detail in the embodiments of the disclosure refer to the abovementioned embodiments for understanding, and will not be elaborated herein.

According to the semiconductor structure according to the embodiments of the disclosure, the capacitor structure extends in the second direction. That is to say, the capacitor structures are arranged horizontally, and the horizontal capacitor structure can reduce the possibility of tipping or breaking, so as to improve the stability of the capacitor structure. In addition, the capacitor structures are arranged in the first direction and the third direction. A stacked structure that is formed by stacking a plurality of capacitor structures in the third direction can form a three-dimensional semiconductor structure, so as to improve the integration degree of the semiconductor structure and realize miniaturization.

In several embodiments provided by the disclosure, it is to be understood that the disclosed device and method may be implemented in a non-target mode. The above described device embodiments are only schematic. For example, the division of the units is only logical function division. In actual implementation, there may be other division modes, for example, a plurality of units or components may be combined, or may be integrated into another system, or some features may be ignored or not implemented.

The characteristics disclosed in several method or device embodiments provided in the disclosure may be freely combined without conflicts to obtain new method embodiments or device embodiments.

The abovementioned descriptions are only some embodiments of the disclosure, but the scope of protection of the disclosure is not limited thereto. Any variation or replacement readily figured out by a person skilled in the art within the technical scope disclosed in the disclosure shall fall within the scope of the protection of the disclosure. Therefore, the scope of the protection of the disclosure shall be subject to the scope of protection of the claims.

What is claimed is:

1. A method for forming a semiconductor structure, comprising:
    providing a substrate, the substrate comprising a first isolation groove extending in a first direction and a plurality of active columns arranged in an array along the first direction and a third direction, the substrate being divided into a first area and a second area by the first isolation groove along a second direction, the active columns being supported through support structures, the first direction, the second direction and the third direction being perpendicular to each other in pairs, the first direction and the second direction being parallel to an upper surface of the substrate;
    forming semi-capacitor structures located in the first area and gate-all-around structures located in the second area in gaps between the active columns;
    processing the active columns and the semi-capacitor structures in the first area to form capacitor structures extending in the second direction; and
    forming first connecting structures connecting the gate-all-around structures and the capacitor structures in the first isolation groove.

2. The method of claim 1, wherein the forming semi-capacitor structures and gate-all-around structures comprises:
    sequentially forming a medium layer and a first metal layer on surfaces of the active columns in the first area and the second area;
    the first metal layer located in the first area constituting the semi-capacitor structure, and the medium layer and the first metal layer located in the second area constituting the gate-all-around structure.

3. The method of claim 2, wherein the substrate further comprises a semiconductor substrate, and the active columns and the supporting structures are formed on the semiconductor substrate; wherein the processing the active columns and the semi-capacitor structures in the first area comprises:
    forming a first opening extending in the first direction in the first area, the first opening exposing the semiconductor substrate;
    removing the active columns and the medium layer in the first area through the first opening to form a first gap; and
    sequentially forming a dielectric layer and a second metal layer in the first opening and the first gap, the first metal layer, the dielectric layer and the second metal layer located in the first area constituting the capacitor structure,
    wherein after forming the first metal layer, the method further comprises:
    forming a first isolation layer between the first metal layers and in the first isolation groove.

4. The method of claim 3, wherein the forming first connecting structures comprises:
    removing the first isolation layer located in the first isolation groove, and removing the medium layer and the first metal layer located on a side wall of the second area in the first isolation groove to form a second isolation groove extending in the first direction, the second isolation groove exposing the active columns in the second area and the first metal layer on a side wall of the first area;
    epitaxially growing the first connecting structure on a surface of the exposed active column, the first connecting structure being in contact with the first metal layer in the first area.

5. The method of claim 4, after forming the first connecting structure, the method further comprises:
    forming a second isolation layer in the second isolation groove and between the first connecting structures, a surface of the second isolation layer being flush with a surface of the first isolation layer.

6. The method of claim 5, further comprising:
    forming a bit line structure, and a stepped word line structure connected to the gate-all-around structure,
    wherein the forming a bit line structure comprises:
    etching an end, far away from the capacitor structure, of the active column to form a bit line trench extending in the first direction, the bit line trench exposing the semiconductor substrate in the second area; and
    filling the bit line trench with a bit line metal material to form the bit line structure, the bit line structure and the gate-all-around structure being spaced by the support structures.

7. The method of claim 6, wherein the substrate further comprises a third isolation groove extending in the second direction, and the gate-all-around structure is divided into a first part and a second part by the third isolation groove in the first direction; the forming a stepped word line structure comprises:
    forming a photoresist layer with a second opening on a surface of the second part, the second opening exposing an end, far away from the first part, of the second part; and
    etching the second part for a plurality of times through the photoresist layer to form the stepped word line structure, wherein a size of the second opening in the first direction increases sequentially during etching for the plurality of times.

8. The method of claim 7, before forming the stepped word line structure, the method further comprises:

removing the first isolation layer located in the third isolation groove, and removing the medium layer and the first metal layer located on a side wall of the second part in the third isolation groove to form a fourth isolation groove extending in the second direction, the fourth isolation groove exposing the first metal layer on a side wall of the first part and the active column of the second part; and forming a second connecting structure connecting the second part and the gate-all-around structure in the fourth isolation groove.

9. The method of claim 8, wherein the forming a second connecting structure comprises:

epitaxially growing the second connecting structure on the surface of the exposed active column of the second part, the second connecting structure being in contact with the first metal layer on the side wall of the first part.

10. The method of claim 9, after forming the second connecting structure, the method further comprises:

forming an insulating medium layer on a surface of the second connecting structure, a surface of the insulating medium layer being flush with a surface of the medium layer;

forming a third metal layer on the surface of the insulating medium layer, a surface of the third metal layer is flush with a surface of the first metal layer; and filling a third isolation material on the surface of the third metal layer and between the third metal layers to form a third isolation layer, a surface of the third isolation layer is flush with the surface of the first isolation layer.

11. The method of claim 10, after forming the third isolation layer, the method further comprises:

forming a first metal wire connected to the capacitor structure, a second metal wire connected to the bit line structure, and a third metal wire connected to the stepped word line structure, wherein the forming a first metal wire, a second metal wire, and a third metal wire comprises:

forming a barrier layer on surfaces of the stepped word line structure, the first isolation layer, the second isolation layer and the third isolation layer;

etching the barrier layer to form a first through hole exposing the second metal layer, a second through hole exposing the bit line structure, and a third through hole exposing the stepped word line structure; and forming the first metal wire in the first through hole, forming the second metal wire in the second through hole, and forming the third metal wire in the third through hole.

12. The method of claim 7, wherein the forming the substrate comprises:

providing a semiconductor substrate;

forming a stacked structure on the semiconductor substrate, the stacked structure comprising first semiconductor layers and second semiconductor layers stacked alternately;

etching the stacked structure to form the first isolation groove; and removing the first semiconductor layers in the stacked structure.

13. The method of claim 12, after forming the first isolation groove, the method further comprises:

etching the stacked structure to form a fifth isolation groove extending in the second direction, the second semiconductor layers being divided into a plurality of active columns arranged in the first direction by the fifth isolation groove; and forming an isolation structure in the fifth isolation groove.

14. The method of claim 13, before forming the first isolation layer, the method further comprises:

etching and removing part of the isolation structure and part of the first semiconductor layers to form a plurality of etched holes extending in the first direction, the etched holes exposing the active columns; and filling the etched holes with a support material to form the support structures surrounding the active columns.

15. The method of claim 14, after forming the first isolation groove and before removing the first semiconductor layers in the stacked structure, the method further comprises:

filling the first isolation groove with a sacrificial material to form a sacrificial layer.

* * * * *